United States Patent
McCormack et al.

(10) Patent No.: US 8,729,905 B2
(45) Date of Patent: May 20, 2014

(54) METHOD OF DETECTING FAULTS ON AN ELECTRICAL POWER LINE

(75) Inventors: Michael Anthony McCormack, Ballycar (IE); Charles Brendan O'Sullivan, Castletroy (IE)

(73) Assignee: General Electric Company, Schenectady, NY (US)

( * ) Notice: Subject to any disclaimer, the term of this patent is extended or adjusted under 35 U.S.C. 154(b) by 1577 days.

(21) Appl. No.: 12/301,941

(22) PCT Filed: May 22, 2007

(86) PCT No.: PCT/EP2007/054972
§ 371 (c)(1),
(2), (4) Date: Jul. 21, 2010

(87) PCT Pub. No.: WO2007/135162
PCT Pub. Date: Nov. 29, 2007

(65) Prior Publication Data
US 2010/0283479 A1    Nov. 11, 2010

(30) Foreign Application Priority Data

May 22, 2006    (IE) .................................. S2006/0402

(51) Int. Cl.
*G01R 31/02*    (2006.01)

(52) U.S. Cl.
USPC ........... 324/543; 324/533; 324/544; 324/537; 324/512; 324/528; 324/555; 324/531

(58) Field of Classification Search
USPC ......... 324/531, 533, 537, 543, 544, 512, 528, 324/555
See application file for complete search history.

(56) References Cited

U.S. PATENT DOCUMENTS

| | | | |
|---|---|---|---|
| 5,481,195 A | 1/1996 | Meyer | |
| 5,650,728 A * | 7/1997 | Rhein et al. | 324/543 |
| 6,385,561 B1 * | 5/2002 | Soraghan et al. | 702/185 |
| 7,698,577 B2 * | 4/2010 | Jones et al. | 713/300 |
| 2003/0021388 A1 * | 1/2003 | Starr et al. | 379/1.04 |
| 2003/0037615 A1 * | 2/2003 | Madaras et al. | 73/598 |
| 2004/0189317 A1 | 9/2004 | Borchert et al. | |
| 2004/0232919 A1 * | 11/2004 | Lacey | 324/533 |

FOREIGN PATENT DOCUMENTS

| | | |
|---|---|---|
| DE | 195 14 698 | 12/1996 |
| JP | 10-248096 | 9/1998 |

OTHER PUBLICATIONS

International Search Report of PCT/EP2007/054972 dated Oct. 2, 2007, pp. 3.

* cited by examiner

*Primary Examiner* — Arleen M Vazquez
*Assistant Examiner* — Alesa Allgood
(74) *Attorney, Agent, or Firm* — Fletcher Yoder, P.C.

(57) ABSTRACT

This invention relates to a method of detecting faults on an electrical power line (7) and a sensor (5) for use in such a method. Preferably, the sensor is a line-mounted sensor (5). The method comprises the initial step of determining an initial impedance profile for the power line (7), and thereafter the method comprises the subsequent steps of the line-mounted sensor (5) transmitting a conducted communication signal (41) along the power line, receiving a reflected signal (43) particular to the transmitted communication signal and correlating the transmitted signal and the reflected signal. By correlating the signals, it is possible to determine the actual impedance of the power line. The actual impedance of the power line may then be compared with the initial impedance profile and it is possible to ascertain whether a fault exists on the power line. Preferably, the method uses an adaptive filter to determine the location of the fault.

20 Claims, 2 Drawing Sheets

METHOD OF DETECTING FAULTS ON AN ELECTRICAL POWER LINE

RELATED APPLICATIONS

The subject application is a U.S. National Stage application that claims the priority of International Application No. PCT/EP2007/054972, filed on 22 May 2007, which claims the priority of Irish National Application No.: S2006/0402, filed on 22 May 2006.

This invention relates to a method of detecting faults on an electrical power line using a line-mounted sensor and additionally relates to a line-mounted sensor for use in such a method.

In order for electricity utility companies to operate their electricity networks in an efficient manner and provide the best possible level of service to their customers, it is necessary for the electricity utility company to carefully monitor their electricity network. To this end, various methods and sensors have been provided to allow the electricity company quickly and accurately determine the location and type of fault being experienced on a particular power line and also the severity of that fault. Typically, these methods and sensors operate by measuring the current flowing in the electricity lines and thereafter process that current information in order to ascertain whether there is a fault in the electricity power line. Although relatively efficient in operation, there are certain difficulties and inadequacies with the known methods. Quite often, it is difficult to obtain accurate results, particularly in low line current conditions, from the known methods and erroneous results are not entirely uncommon.

It is an object therefore of the present invention to provide a method and sensor for detecting faults on an electrical power line that overcome at least some of these difficulties that is relatively simple to implement and efficient in operation.

STATEMENTS OF INVENTION

According to the invention, there is provided a method of detecting faults on an electrical power line using a line-mounted sensor comprising the steps of determining an initial impedance profile for the power line, the line-mounted sensor transmitting a conducted communication signal along the power line, the line-mounted sensor receiving a reflected signal particular to the transmitted communication signal from along the power line, correlating the reflected signal and the transmitted signal and determining the actual impedance of the power line, comparing the actual impedance of the power line with the initial impedance profile and ascertaining whether a fault exists on the power line. By having such a method, the sensors determine the impedance in a power line and compare that impedance with an initial impedance profile for the power line. Any change in the impedance of the power line may be detected in a relatively straightforward manner and certain faults that may cause as little as 5% change in the impedance of the line may be detected and rectified by the electricity supplier. By using such a method, it is possible to monitor normally open points in the network, line open circuits can be located even in low line current conditions, line down conditions may be determined and shorts including phase-to-phase and phase-to-ground may be determined in a relatively straightforward manner. This is achieved by transmitting signals directly over the power line and capturing the reflected signals on that power line. By using this information, it is possible to determine the impedance profile along the length of the power line and changes in impedance may be quickly identified.

In one embodiment of the invention, the step of correlating the reflected signal and the transmitted signal further comprises passing the signals through an adaptive filter. This is seen as a particularly useful and simple way of correlating the reflected signal with the transmitted signal.

In another embodiment of the invention, the step of passing the signals through an adaptive filter further comprises passing the signals through an adaptive Finite Impulse Response (FIR) filter having a model of the electrical power line represented using one or more delay units and one or more variable coefficients, and the step of correlating the transmitted and reflected signals comprises choosing suitable values for the one or more variable coefficients to minimise the reflected signal.

In a further embodiment of the invention, suitable values for the one or more variable coefficients are chosen using least mean square (LMS) techniques. It is envisaged that LMS techniques may provide enhanced performance with larger number of taps.

In one embodiment of the invention, suitable values for the one or more variable coefficients are chosen using recursive least square (RLS) techniques. It is envisaged that the RLS techniques may have an advantage for implementations with lower tap counts.

In another embodiment of the invention, the method further comprises the step of determining the location of a fault on the power line by ascertaining the one or more variable coefficients that are different to an initial value of variable coefficient in the initial impedance profile. This is seen as particularly useful as the location of a fault may be ascertained in a quick and straightforward manner which will facilitate the electricity supplier in coordinating their repair servicemen to fix the fault if necessary in as short a time as possible. The variable coefficient that changes significantly will indicate that the fault is at that location on the power line represented by the variable coefficient.

In a further embodiment of the invention, the method comprises the step of the line-mounted sensor processing the signal information to determine whether there is a fault. By processing the information on the sensor, the computational burden may be placed on the sensor, as opposed to transmitting large amounts of data to a central point for processing. If the sensor detects a fault in the network, it may then transmit an alert to a central controller so that the operator of the electricity network can take further action. Alternatively, the method comprises the step of the line mounted sensor transmitting the signal information to a remote central controller for processing and fault detection on the central controller. This may help to minimise the expense of the line-mounted sensor.

In one embodiment of the invention, the method further comprises the initial step of generating a line impedance map for an electricity grid of which the electricity line forms part thereof. In this way, the operator of the electricity network can be aware of the impedance characteristics of the entire electricity grid which will facilitate quick detection of changes in the impedance in that grid and allow them to ascertain potential causes of those impedance changes such as a phase-to-phase shorts or line down conditions.

In another embodiment of the invention, the step of transmitting the communication signal along the line comprises transmitting the communication signal using conducted communications techniques. Preferably, the communication signal is transmitted using Broadband Power Line (BPL) techniques. This is seen as a particularly preferred embodiment of the invention as the signals may be transmitted directly onto the line using the conducted communications and additional separate equipment for communications with a central controller or the like will not have to be provided.

In another embodiment of the invention, the fault is detected by determining the polarity and/or the magnitude of the coefficient of reflection.

In a further embodiment of the invention, the step of ascertaining whether a fault exists further comprises determining the type of fault.

In one embodiment of the invention, there is provided a sensor for monitoring faults in a power line comprising a transmitter for transmitting a conducted communications signal over the power line and a receiver for receiving a reflected signal over the power line, the sensor further comprising communication means to communicate with a remote central controller.

In a further embodiment of the invention there is provided a sensor for monitoring faults comprising a memory for storage of an initial impedance profile for the power line and a processor for correlating the transmitted conducted communications signal and the reflected signal and determining the actual impedance profile of the power line and thereafter comparing the initial impedance profile with the actual impedance profile to determine whether a fault exists on the power line.

In another embodiment of the invention, the sensor further comprises an adaptive filter for determining the location and/or the magnitude of a fault. Preferably, the adaptive filter is a Finite Impulse Response (FIR) filter.

In a further embodiment of the invention, the transmitter and receiver are provided by way of a conducted communications modem. Preferably, the conducted communications modem is a BPL modem.

DETAILED DESCRIPTION OF THE INVENTION

The invention will now be more clearly understood from the following description of some embodiments thereof, given by way of example only, with reference to the accompanying drawings, in which.

Figure 3A:
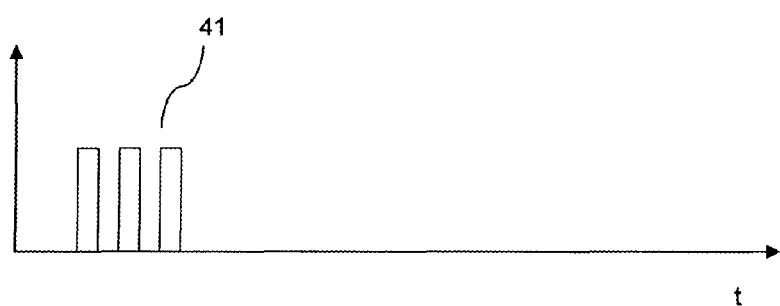
Figure 3B:
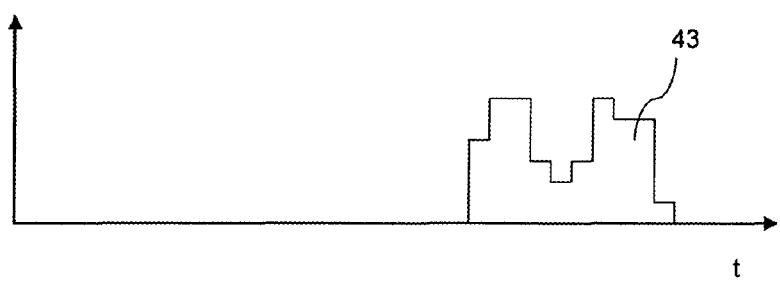

FIGS. 3(a) and 3(b) are diagrammatic representations of a transmitted conducted communications signal and a reflected signal respectively.

Figure 1:
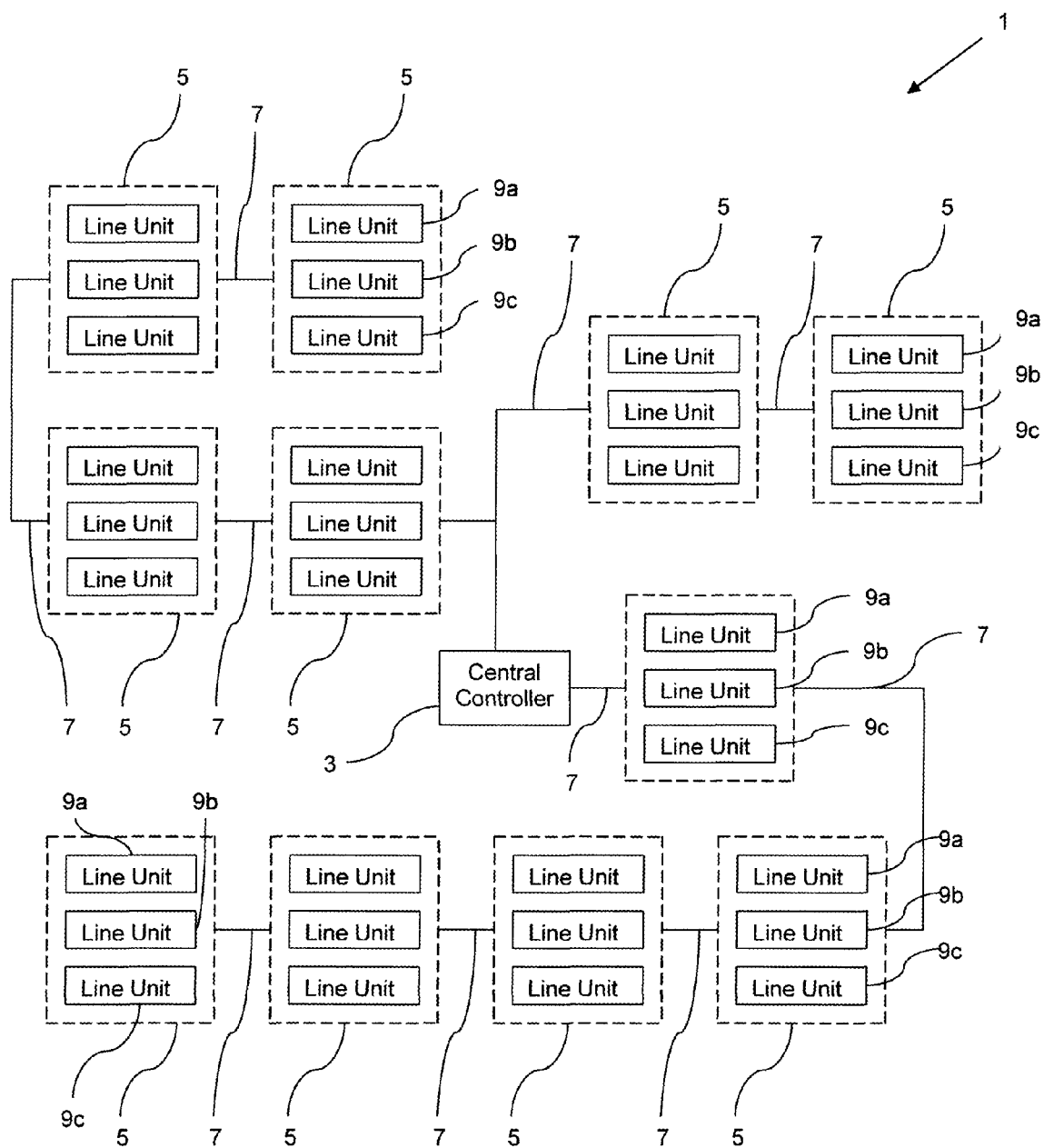
FIG. 1 is a block diagram of a monitoring system used to monitor an electricity grid network in which the method according to the invention is carried out.

Referring to the drawings, and initially to FIG. 1 thereof, there is shown a monitoring system, indicated generally by the reference numeral 1, comprising a central controller 3 and a plurality of remote line-mounted sensors 5. The line-mounted sensors 5 are mounted remotely from the central controller 3 directly on the electrical power lines 7. The remote sensors typically comprise a triplet of line units 9(a), 9(b), 9(c), each of which is mounted on a different phase of the electricity grid to the other line units. The line units 9(a), 9(b), 9(c) coordinate to send measurement information to the central controller for monitoring by the electricity network operator.

In use, each line mounted sensor 5 determines an initial impedance profile for the power line upon which it is mounted. This is achieved by the line mounted sensor transmitting a conducted communications signal along the power line on set-up and the line-mounted sensor thereafter receiving a reflected signal particular to the transmitted conducted communications signal from the power line. The line-mounted sensor is able to build an initial impedance profile from the reflected signal. At the stage the initial impedance profile is being built, the line mounted sensor and the operator know that the line is fault free. During operation, the line mounted sensor transmits conducted communication signals along the power line and carefully monitors the reflected signals particular to that transmitted conducted communications signal. The line mounted sensor correlates the reflected signal and the transmitted signal and determines the actual impedance of the power line upon which it is mounted. The line mounted sensor compares the actual impedance of the power line with the initial impedance profile and ascertains whether the impedance of the line has changed and whether a fault exists on the power line.

It is known that if an ideal transmission line is terminated in its characteristic impedance then the level of reflection in the transmission line will be negligible. However, this is almost always not the case and if the line is not terminated in its characteristic impedance, then reflections of the signal at the interface will occur. The level and polarity of the reflections are an index of the termination mismatch. The coefficient of reflection, $\Gamma$, may be determined using the equation:

$$r = \frac{Z_L - Z_0}{Z_L + Z_0}$$

where $Z_o$ is the impedance of the line at a given point, intrinsic impedance, and $Z_L$ is the impedance of the line downstream, possibly a fault point, termination impedance or branch point in the line. Therefore, it can be seen that if the impedance of the line should change due to a fault occurring such as an open point, a line down condition or a short including phase-to-phase or phase-to-ground shorts occurs, the co-efficient of reflection of the line will also change. By changing the impedance of the line, the coefficient of reflection will change and hence either more or less (or different) reflected signals will be received by the sensor subsequent to transmission of the conducted communication signal. From that, the sensor will be able to determine that if there is more or less reflected signals than at the initial start-up, the conditions of the line and in particular the impedance of the line, will have changed and accordingly there is a fault on the line. The magnitude and polarity of the co-efficient of reflection may be used to determine the type of fault being experienced on the line.

Each sensor 5 comprises an adaptive filter (not shown) and the reflected signal and the transmitted signal are correlated by passing the signals through the adaptive filter. The adaptive filter essentially provides a model of the power line and comprises a plurality of delay units and a plurality of variable coefficients. The delay units and variable coefficients represent the impedance of a given section of the power line 7. If the variable coefficient should change significantly, this indicates a fault in the corresponding section of power line. In this way, the position of the line fault may also be determined to a reasonable degree of accuracy. In this way, the line sensors determine whether or not there is a fault themselves. Alternatively, the line sensors could transmit the information to the central controller 3 for processing on the central controller. Each of the line mounted sensors transmits the communication signal along the line using conducted communications techniques, in this case Broadband Power Line (BPL) techniques are used. The reflected signal is also received in the power line using conducted communications techniques.

Figure 2:
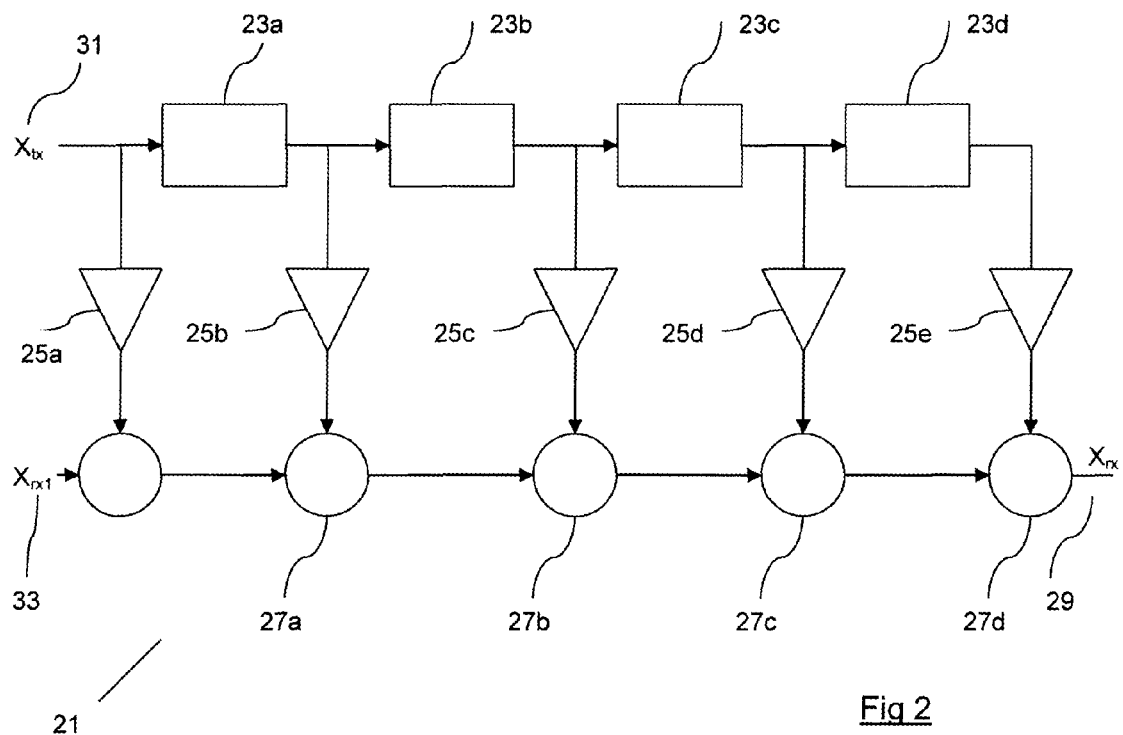
FIG. 2 is a block diagram of an adaptive filter.

Referring now to FIG. 2 of the drawings, there is shown an adaptive filter, indicated generally by the reference numeral 21 and more specifically an adaptive finite impulse response (FIR) filter. The FIR filter 21 comprises a plurality of delay units 23(a), 23(b), 23(c), 23(d), a plurality of variable coefficients 25(a), 25(b), 25(c), 25(d), 25(e) and a plurality of summation units 27(a), 27(b), 27(c) and 27(d). The variable coefficients 25(a) to 25(e) are essentially multipliers and together with the delay values 23(a) to 23(d) represent a model of the transmission line. In the embodiment shown, only four delay units and fiver variable coefficients are used. However, in practice, in order to accurately monitor the power line, several hundred delay units and several hundred variable coefficients may be used to model the line. The number of units that may be used is practically without limit and the number of units used will depend on the level of resolution required by the operator of the network.

The values of the variable coefficients are adjusted to minimise a reflected signal in the received signal, indicated as $X_{rx}$. $X_{rx}$ is the net received signal, or in other words, the signal with the transmitted content removed. This would otherwise cause interference in a communications channel. This signal would be ideally "zero" if no external signal were received. In order to determine the values of the variable coefficients, it is possible to use the least mean square (LMS) adaptive filter approach or recursive-least-square (RLS) adaptive filter approach. The FIR filter may be integral to the BPL conducted communications implementation or it may be an extension to it or indeed a separately executed algorithm, depending on the amount of processing power available on the sensor and the specific implementation of BPL.

$X_{tx}$ is a sample of a transmitted signal and $X_{rx1}$ is a sample of a received signal. 25a represents reflection for the line hybrid line impedance mismatch adjacent to the unit. In use, each sensor, which knows the reflected signal value $X_{rx}$ and the transmitted signal value $X_{tx}$ is able to use the LMS adaptive filter or RLS adaptive filter approaches to determine the variable coefficients of the multipliers 25(a) to 25(d) in order to minimise the reflected signal $X_{rx}$. In order to do this, the variable coefficients will change and they give an indication of the location of a fault, if appropriate, in the network. Furthermore, the magnitude and polarity of the variable will also give an indication of the type of fault being experienced. For the initial impedance profile, the variables will be a constant value. However, when a fault occurs on the line, one or more of the variables may change, indicating a fault on the line. The variable that changes most significantly will indicate a fault at that point in the power line represented by the filter. Each delay element may represent a length of line, for example, 50M of cable and depending on the variable coefficient to change, the exact location of the fault may be determined from the new variable coefficients.

Both RLS and LMS are methods of adjusting the coefficients 25(a), 25(b), 25(c), 25(d) and 25(e) to minimise the reflection from the line by modelling the line with the filter structure. 25a is the coefficient associated with zero delay. While 25e is the coefficient associated with 4 delays. In practice it is envisaged that at least 100 delays, perhaps several thousand delays will be provided, dependent on available computational resources. It will be noted that the reflected signal is after the adaptive filter. Essentially the present invention attempts to model the line and in essence the error term is the difference between the model and the physical line. The present invention adjusts the model parameters to match the physical world. If it were to match exactly the result would be zero difference or perfect cancellation.

Referring to FIGS. 3(a) and 3(b), there is shown an example of a transmitted conducted communications signal 41 and a reflected signal 43 respectively. As can be seen, the transmitted communications signal is a pulse train containing a predetermined sequence of pulses. The pulses have a predetermined duration, frequency and amplitude. A record of the transmitted signal is stored in memory. Alternatively, a single pulse of predetermined duration and amplitude may be used as the transmitted conducted signal but it is deemed more advantageous to have a pulse train. The pulse train may be a random signal such as noise. What is important is that the signal sent may be useful for distinguishing reflected signals corresponding to the transmitted signal. Referring specifically to FIG. 3(b), the reflected signal 43 comprises a the sum of a plurality of reflections or echoes from along the power line. These result in a pattern that may be similar to that shown in FIG. 3(b). This pattern of reflected signal may then be manipulated in the adaptive filter along with the transmitted signal to determine the impedance of the various sections of the line. If one section's impedance should change significantly, then the variable coefficient associated with that section will also change thereby indicating a fault in that particular location. It will be understood that the actual transmitted conducted signal and the reflected signal in particular may vary considerably from those shown in the drawings and the drawings are intended to be representative of the signals only.

Ideally, prior to implementing the network, on installation, the electricity network supplier will build a line impedance map for the entire network so that the line impedance shown at each of the sensors, under normal working conditions, are known. Once these are known, any variations from the initial line impedance map may be detected in a relatively straightforward manner and the type and location of the fault may be determined simply by using the impedance of the line. It is possible to determine the distance to the discontinuity and the relative magnitude of the discontinuity. Furthermore, it is possible for the sensor to give a partial but valuable determination of the network topology. It is important to note, however, that in certain cases of symmetrical branching, it may not be possible to precisely locate a fault that manifests itself as a line discontinuity, however, it will be possible to detect that there is a fault on the network. This is where the additional knowledge of the electricity network operator of their network may be valuable in determining the location of the fault.

By using the system according to the invention, normally open points may be monitored in a simple and effective manner and line open circuits can also be located even in low line current conditions. Phase-to-phase shorts and phase-to-ground shorts can also be determined. One of the major advantages of the current application is that line down conditions can also be determined by the change of characteristic impedance on the line. Certain faults are often very difficult to determine in certain conditions. For example, in certain circumstances, when a line falls down and is in contact with the ground, it may not cause the safety mechanisms to trip. This is particularly the case if the line is located in particularly arid areas such as areas with very dry earth or a high concentration of silica, i.e. sand. In those instances, with the known systems, the line could go down in an area such as this without tripping the safety mechanisms and cause a potentially lethal safety hazard. However, with the current system, the earth would act as a dielectric material, would modify the characteristic impedance of the line by anywhere between 5% and above which could be detected by the operator of the system who could take appropriate action to remove power from the line and send repair personnel to rectify the fault.

The invention uses the pseudo-random nature of the transmitted data to determine non-frequency specific impedance. This is important for determining the actual impedance of the lines and to carry out accurate measurements. In this specification, various methods have been described for launching the conducted communications along the power line including BPL communication techniques using a BPL modem. It is envisaged that other methods may be used for the conducted communication techniques such as a transformer or a suitable antenna for launching the conducted communications signal and receiving the reflected signal. Typical launching methods include iron, ferrite, or air core transformers. This is seen as a useful approach to implement. Also, coupling by capacitor using adjacent lines may be used. Furthermore, although in the embodiments shown, the sensor has comprised a triplet of line units, it will be understood that in certain implementations this may not be necessary and in fact a single sensor comprising a single unit or a sensor comprising a pair of units may be used to good effect. Preferably, the units will be line mounted units.

Throughout this specification, reference has been made to an adaptive filter. An adaptive filter is a computational device that attempts to model the relationship between two signals in real time in an iterative manner. The present invention endeavors to model the power line by transmitting signals onto the line and examining the response at a receiver input. When using the same adaptive filter for communications such as BPL (or power line carrier) and for diagnostic line characterisation, the model will be constrained by computational limits: in this case, the adaptive filter used for communications is likely to be a sub-model of the diagnostic model. For example, it will have less taps and a smaller number of real time arithmetic operations. The greater the number of taps the greater the distance covered. The greater the sampling rate the better the time resolution. To model a 30 km line with a sample rate of 10M samples/second would require 2000 Taps. Therefore, it will take a signal 200 uS to complete the roundtrip. The overhead power line effectively has an air dielectric and therefore the speed of signals on the line is close to that of the speed of light in air, 300 m/uS.

Two types of adaptive filter are envisaged as being the most simple to implement with the present invention. The basic FIR (finite impulse response) type is illustrated in the specification. In addition an IIR filter (an infinite response filter) may be used. It this case, the filter has a ladder like structure that includes feedback terms. In addition a third type of filter may used, a so-called "lattice filter". It is claimed that this filter type has improved convergence characteristics. (see Friedlander, B., Lattice filters for adaptive processing, Proc. IEEE 70(8), 829-867, August 1982., the entire disclosure of which in relation to the construction of lattice filter is incorporated herein by way of reference)

The adaptive filter needs to be tuned. In other words, the coefficients of the model need to be determined. A common technique is the LMS (least mean square) algorithm used in conjunction with the FIR structure. It is envisaged however that there are several techniques that could be used to provide a suitable solution. These include that of Wierner, as described for discrete systems by Levinson, (see Levinson, N., The Wierner RMS (root-mean-square) error criterion in filter design and prediction, J. Math Phys., 25, 261-278, 1947.) A further method is the so-called "Method of Steepest Descent" also known as the "LMS algorithm". It is understood that adaptive filters have not been used in power monitoring to date but are used in a wide range of other applications including system identification in control applications (plant identification), echo cancellation in long distance communications, acoustic echo cancellation (including top-end speaker phones and public address systems), and noise cancellation.

The system may operate on a single point on the network, in the substation for example. It may also be integrated into the line unit. This would reduce the computational challenges. This would be traded off against ease of powering the device. The system may operate using reflected signals only or it may operate using transmitted signals: essentially two systems acting in concert and could be implemented using two line units. The communications means or the test signal characteristics are chose to minimise interference signals and comply with local electromagnetic compatibility requirements. Although throughout this specification the invention has been described in terms of line mounted sensors, it is envisaged that the technique can also be used with off line sensors, this might be applicable to a cable product.

Furthermore, the term communications signal has been used throughout and it will be understood that the transmitted signal need not a "communications" signal per se, in that it is communicating with another party. In this case the line sensor would try to model the line in its vicinity using a "test" signal. The benefit of using the line borne communications signal is that the line mounted sensors may already have suitable interface components to the power line so we get a level of line characterisation without requiring further investment. Furthermore, a software-based solution may be all that is required to implement the method.

In the specification the terms "comprise, comprises, comprised and comprising" and the terms "include, includes, included and including" are all deemed totally interchangeable and should be afforded the widest possible interpretation.

The invention is in no way limited to the embodiment hereinbefore described, but may be varied in both construction and detail.

The invention claimed is:

1. A method for detecting faults on one or more electrical power lines using a plurality of line-mounted sensors, comprising:
   determining, via at least one of the plurality of line-mounted sensors, an initial impedance profile that corresponds to a first power line of the one or more electrical power lines, wherein each of the plurality of line-mounted sensors is configured to be directly fixed onto one of the electrical power lines;
   transmitting, via the at least one of the plurality of line-mounted sensors, a conducted communication signal along the power line;
   receiving, via the at least one of the plurality of line-mounted sensors, a reflected signal associated with the conducted communication signal from along the power line;
   correlating, via the at least one of the plurality of line-mounted sensors, the reflected signal and the conducted communication signal; and
   determining, via the at least one of the plurality of line-mounted sensors, the actual impedance of the power line based on the correlation;
   comparing, via the at least one of the plurality of line-mounted sensors, the actual impedance of the power line with the initial impedance profile; and
   ascertaining, via the at least one of the plurality of line-mounted sensors, whether a fault exists on the power line based on a comparison between the actual impedance and the initial impedance profile.

2. The method of claim 1, comprising processing, via the at least one of the plurality of line-mounted sensors, the reflected signal and the conducted communication signal to determine whether there is a fault.

3. The method of claim 1, comprising transmitting, from the at least one of the plurality of line-mounted sensors, the reflected signal and the conducted communication signal to a remote central controller for processing and fault detection.

4. The method of claim 1, comprising generating a line impedance map for an electricity grid having the power line.

5. The method of claim 1, wherein the conducted communication signal is transmitted using Broadband Power Line (BPL) techniques.

6. The method of claim 1, wherein the fault is detected by determining a polarity and/or a magnitude of a coefficient of reflection.

7. The method of claim 1, wherein ascertaining whether the fault exists comprises determining a type of the fault.

8. The method of claim 1, wherein the conducted communication signal is transmitted while the first power line is conducting current.

9. The method of claim 1, wherein correlating the reflected signal and the conducted communication signal comprises passing the reflected signal and the conducted communication signal through an adaptive filter.

10. The method of claim 9, wherein passing the reflected signal and the conducted communication signal through the adaptive filter comprises passing the reflected signal and the conducted communication signal through an adaptive Finite Impulse Response (FIR) filter having a model of the first power line represented using one or more delay units and one or more variable coefficients, and wherein correlating the conducted communication signal and the reflected signal comprises choosing suitable values for the one or more variable coefficients to minimize the reflected signal.

11. The method of claim 10, wherein the suitable values for the one or more variable coefficients are chosen using least mean square (LMS) techniques.

12. The method of claim 10, wherein the suitable values for the one or more variable coefficients are chosen using recursive least square (RLS) techniques.

13. The method of claim 10, comprising determining a location of the fault on the first power line by ascertaining that the one or more variable coefficients are different to an initial value of a variable coefficient in the initial impedance profile.

14. A system for monitoring faults, comprising:
a plurality of sensors configured to be directly fixed onto one or more power lines, wherein each of the plurality of sensors comprise:
a transmitter configured to transmit a conducted communication signal over a power line;
a receiver configured to receive a reflected signal over the power line; and
a communication component configured to communicate with a remote central controller communicatively coupled to the plurality of sensors.

15. The system of claim 14, wherein each of the plurality of sensors comprise:
a memory for storage of an initial impedance profile that corresponds to the power line; and
a processor configured to:
correlate the conducted communication signal and the reflected signal; and
determine the actual impedance profile of the power line; and
compare the initial impedance profile with the actual impedance profile to determine whether a fault exists on the power line.

16. The system of claim 15, wherein each of the plurality of sensors comprises an adaptive filter configured to determine a location and/or a magnitude of the fault.

17. The system of claim 16, wherein the adaptive filter comprises a Finite Impulse Response (FIR) filter.

18. The system of claim 14, comprising at least three line units.

19. A system, comprising:
a first sensor configured to:
determine a first initial impedance profile that corresponds to a first power line in an electricity network, wherein the first sensor is configured to be directly fixed onto the first power line;
transmit a first communication signal along the first power line;
receive a first reflected signal associated with the first communication signal via the first power line; and
determine a first actual impedance of the first power line based on the first reflected signal and the first communication signal; and
determine whether a first fault exists on the first power line based on the first actual impedance and the first initial impedance profile.

20. The system of claim 19, comprising a second sensor configured to:
determine a second initial impedance profile that corresponds to a second power line in the electricity network, wherein the second sensor is configured to be directly fixed onto the second power line;
transmit a second communication signal along the second power line;
receive a second reflected signal associated with the second communication signal via the second power line; and
determine a second actual impedance of the second power line based on the second reflected signal and the second communication signal; and
determine whether a second fault exists on the second power line based on the second actual impedance and the second initial impedance profile.

* * * * *